(12) United States Patent
Takahashi et al.

(10) Patent No.: US 7,893,458 B2
(45) Date of Patent: Feb. 22, 2011

(54) SEMICONDUCTOR DEVICE HAVING LATERAL MOS TRANSISTOR AND ZENER DIODE

(75) Inventors: Shigeki Takahashi, Okazaki (JP); Takashi Nakano, Nukata-gun (JP); Nozomu Akagi, Nukata-gun (JP); Yasushi Higuchi, Okazaki (JP); Tetsuo Fujii, Toyohashi (JP); Yoshiyuki Hattori, Aichi-gun (JP); Makoto Kuwahara, Nagoya (JP); Kyoko Okada, Nagoya (JP)

(73) Assignee: DENSO CORPORATION, Kariya (JP)

( * ) Notice: Subject to any disclaimer, the term of this patent is extended or adjusted under 35 U.S.C. 154(b) by 643 days.

(21) Appl. No.: 11/892,819

(22) Filed: Aug. 28, 2007

(65) Prior Publication Data

US 2008/0054325 A1 Mar. 6, 2008

(30) Foreign Application Priority Data

Sep. 1, 2006 (JP) ............................. 2006-237766

(51) Int. Cl.
*H01L 29/74* (2006.01)
*H01L 29/76* (2006.01)

(52) U.S. Cl. ............... 257/141; 257/343; 257/E27.016; 257/E27.033

(58) Field of Classification Search ................ 257/327, 257/341, E27.033, E27.016, 141, 343; 345/76
See application file for complete search history.

(56) References Cited

U.S. PATENT DOCUMENTS

| | | | | |
|---|---|---|---|---|
| 5,304,827 A | * | 4/1994 | Malhi et al. .................. 257/262 |
| 5,386,136 A | * | 1/1995 | Williams et al. ............. 257/409 |
| 5,925,910 A | * | 7/1999 | Menegoli ..................... 257/335 |
| 6,348,716 B1 | * | 2/2002 | Yun ............................ 257/356 |
| 6,465,839 B2 | | 10/2002 | Takahashi et al. |
| 6,552,390 B2 | * | 4/2003 | Kameda ...................... 257/335 |
| 6,614,633 B1 | | 9/2003 | Kohno |
| 6,700,156 B2 | | 3/2004 | Saitoh et al. |
| 6,888,711 B2 | | 5/2005 | Kohno |
| 7,247,923 B2 | * | 7/2007 | Yoshida et al. .............. 257/517 |
| 7,709,891 B2 | * | 5/2010 | Mauder et al. .............. 257/341 |
| 2003/0006415 A1 | * | 1/2003 | Yokogawa et al. ............ 257/77 |
| 2003/0127687 A1 | * | 7/2003 | Kumagai et al. ............ 257/335 |
| 2003/0209741 A1 | | 11/2003 | Saitoh et al. |
| 2007/0023830 A1 | * | 2/2007 | Pfirsch et al. ................ 257/341 |

(Continued)

FOREIGN PATENT DOCUMENTS

EP 1 143 598 10/2001

(Continued)

OTHER PUBLICATIONS

U.S. Appl. No. 11/723,967, filed Mar. 22, 2007, Aoki et al.

*Primary Examiner*—Wael M Fahmy
*Assistant Examiner*—Sarah K Salerno
(74) *Attorney, Agent, or Firm*—Posz Law Group, PLC

(57) ABSTRACT

A semiconductor device includes: a semiconductor substrate; a lateral MOS transistor disposed in the substrate; a Zener diode disposed in the substrate; and a capacitor disposed in the substrate. The transistor includes a drain and a gate, and the diode and the capacitor are coupled in series between the drain and the gate. This device has minimized dimensions and high switching speed. Further, both of a switching loss and a surge voltage are improved.

20 Claims, 8 Drawing Sheets

U.S. PATENT DOCUMENTS

2007/0080905 A1 * 4/2007 Takahara .................... 345/76
2008/0197441 A1 * 8/2008 Mauder et al. ............. 257/487

FOREIGN PATENT DOCUMENTS

| JP | A-62-095402 | 5/1987 |
| JP | 02025107 A * | 1/1990 |
| JP | 2005236679 A * | 9/2005 |

* cited by examiner

SEMICONDUCTOR DEVICE HAVING LATERAL MOS TRANSISTOR AND ZENER DIODE

CROSS REFERENCE TO RELATED APPLICATION

This application is based on Japanese Patent Application No. 2006-237766 filed on Sep. 1, 2006, the disclosure of which is incorporated herein by reference.

FIELD OF THE INVENTION

The present invention relates to a semiconductor device having a lateral MOS transistor and a Zener diode.

BACKGROUND OF THE INVENTION

A semiconductor device wherein a lateral diffused MOS transistor element is formed at the surface layer part of a semiconductor substrate, and a method for manufacturing the semiconductor device are disclosed in, for example, JP-A-2001-352707, which corresponds to EP 1143598-A2.

FIG. 10 is a schematic sectional view of a semiconductor device 100 which is the semiconductor device disclosed in EP 1143598-A2. The semiconductor device 100 shown in FIG. 10 is formed on an SOI substrate which consists of a p-type silicon substrate 2, an insulating layer 3 and an n-type layer 1. In the semiconductor device 100, an n-type region 6 which is formed to be higher in concentration than the n-type layer 1 and whose concentration becomes higher at its position nearer to an $n^+$-type drain region 5 is arranged so as to surround the $n^+$-type drain region 5. Further, a $p^+$-type contact region 9 which is arranged in adjacency to an $n^+$-type source region 8 is formed so as to extend under the $n^+$-type source region 8. By the way, in FIG. 10, numeral 4 designates a LOCOS oxide film, numeral 10 a gate insulating film, numeral 11 a gate electrode, numeral 12 an inter-layer insulating film, numeral 13 a source electrode, and numeral 14 a drain electrode.

The semiconductor device 100 shown in FIG. 10 is the semiconductor device formed with the lateral diffused MOS transistor element (LDMOS, Lateral Diffused Metal Oxide Semiconductor) in which a source and a drain are arranged at the surface layer part of the n-type layer 1, so that carriers flow in the lateral direction of the semiconductor substrate. Since the LDMOS is capable of high-speed switching as compared with any other transistor element, it is utilized in, for example, a switching circuit or a switching power source in which a transistor element is turned ON/OFF at high speed.

In general, in the switching circuit such as DC-DC converter or inverter, as the operating frequency of the circuit is heightened more, an accessory inductance or capacitance becomes smaller, so that the size of the circuit can be made smaller. For this purpose, a transistor element of highest possible switching speed is required. On the other hand, when a transistor element is switched at high speed, the overshoot of a drain voltage (surge voltage) arises due to the abrupt voltage change (dV/dt) of the transistor element. Accordingly, induced noise increases, and also a switching loss increases.

A semiconductor device which is intended to solve the above problem of the transistor element applied to the switching circuit is disclosed in JP-A-2004-6598, which corresponds to U.S. Pat. No. 6,700,156.

FIG. 11 is a schematic perspective view partially shown in sections, of a semiconductor device 90 which is the semiconductor device disclosed in U.S. Pat. No. 6,700,156. The semiconductor device 90 shown in FIG. 11 is a semiconductor device formed with a vertical diffused MOS transistor element (VDMOS, Vertical Diffused Metal Oxide Semiconductor) in which a source and a drain are arranged on both the sides of a semiconductor substrate, so that carriers flow in the vertical direction of the semiconductor substrate. This semiconductor device 90 of FIG. 11 features that a p-layer 14 which contains an impurity of p-conductivity type at a low concentration is disposed at a position adjoining a p-base layer 12.

In the semiconductor device 90 of FIG. 11, owing to the formation of the p-layer 14, a gate-drain capacitance can be enlarged more as a drain voltage becomes higher, thereby to suppress the appearance of a surge voltage at the drain. However, the formation of the p-layer 14 is effective only in the semiconductor device 90 having the VDMOS structure. When a similar p-layer 14 is formed in the semiconductor device having the LDMOS structure, the design of the LDMOS becomes difficult on account of great influence on a carrier flow path. Besides, in the semiconductor device 90, the carriers flow through the p-layer 14 of the low impurity concentration, and hence, an ON-resistance becomes high. Further, merely by the formation of the p-layer 14, the increase of the gate-drain capacitance is insufficient, and the effect of the suppressing the surge voltage is unsatisfactory.

Therefore, a new switching circuit K1 shown in FIG. 12 as a related art has been formed in order to avoid the problems of the transistor elements which are applied to the switching circuits.

The switching circuit K1 of FIG. 12 is a switching circuit in which, by changing-over the gate voltage of a transistor T5, the path between a drain D and a source S forming the main electrodes of the transistor T5 is temporally changed-over between a conductive state and a non-conductive state. In the switching circuit K1, the drain D and gate G of the transistor T5 are connected by a series circuit which consists of a Zener diode Dz and a capacitor C. Thus, while a drain voltage is low, the Zener diode Dz is not turned ON, to establish a state where the capacitance of the capacitor C does not contribute, so that a drain current and the drain voltage change at high speed to make a switching loss slight. On the other hand, when the drain voltage rises, the Zener diode Dz breaks down, and the capacitance of the capacitor C is added in the D-G path, so that the drain current and the drain voltage change at low speed to suppress a surge voltage to a low level. In the above way, the switching circuit K1 shown in FIG. 12 is the switching circuit which can simultaneously suppress both the switching loss and the surge voltage. Incidentally, regarding the invention of the switching circuit, a Japanese patent application No. 2006-86225 (i.e., U.S. patent application Ser. No. 11/723,967) has already been filed.

Thus, it is required to provide a semiconductor device which is well suited for the configuration of a switching circuit, and it is also required to provide a semiconductor device formed with a lateral diffused MOS transistor capable of high-speed switching, which semiconductor device can simultaneously suppress both a switching loss and a surge voltage (noise) and which is small in size and low in price.

SUMMARY OF THE INVENTION

In view of the above-described problem, it is an object of the present disclosure to provide a semiconductor device having a lateral MOS transistor and a Zener diode.

According to an aspect of the present disclosure, a semiconductor device includes: a semiconductor substrate; a lateral MOS transistor disposed in the substrate; a Zener diode disposed in the substrate; and a capacitor disposed in the substrate. The transistor includes a drain and a gate, and the diode and the capacitor are coupled in series between the drain and the gate.

This device has minimized dimensions and high switching speed. Further, both of a switching loss and a surge voltage are improved.

BRIEF DESCRIPTION OF THE DRAWINGS

The above and other objects, features and advantages of the present invention will become more apparent from the following detailed description made with reference to the accompanying drawings. In the drawings:

FIG. 2A is a circuit diagram of a switching circuit K2 which was employed in the simulations of the characteristics of the semiconductor device 101, while

DETAILED DESCRIPTION OF THE PREFERRED EMBODIMENTS

First Embodiment

Figure 1:
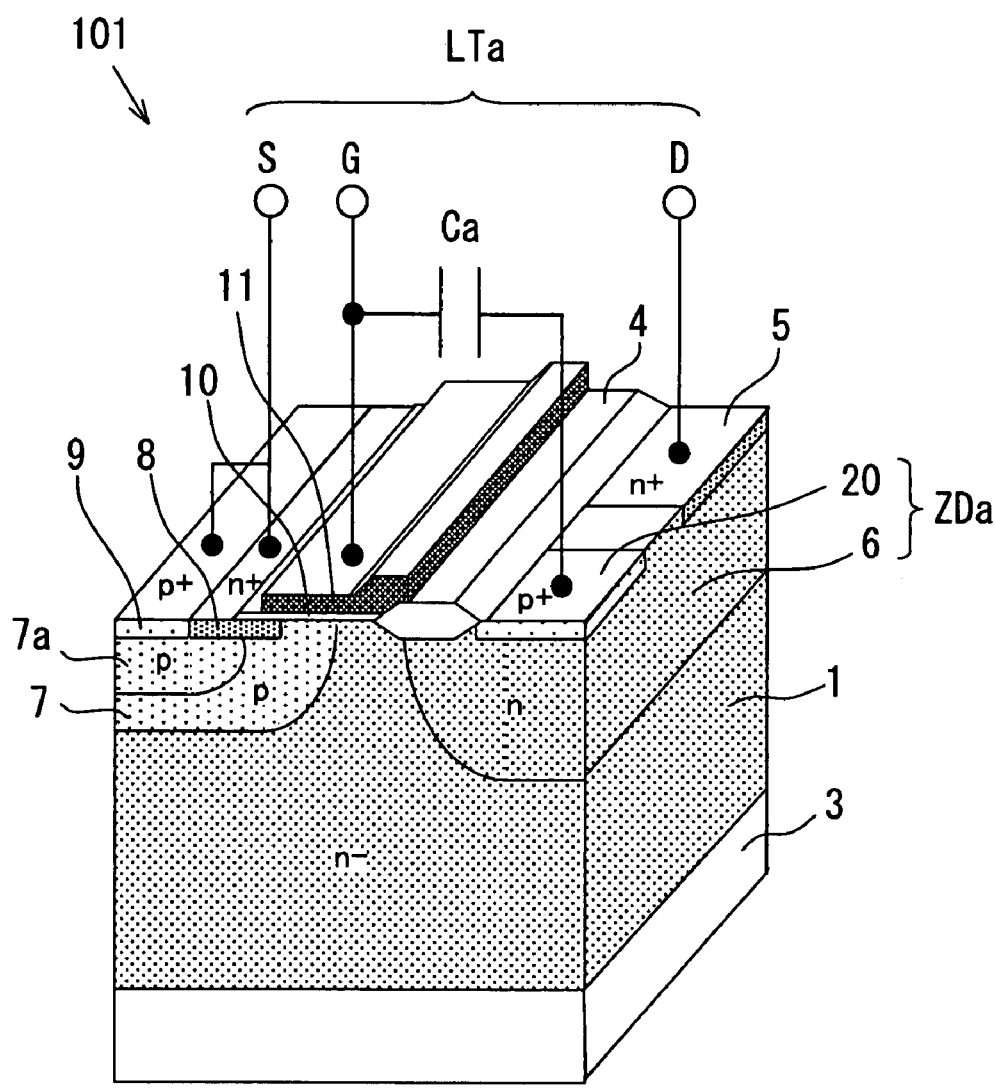
FIG. 1 is a schematic perspective view showing a relevant part, partially in section, of a semiconductor device 101 which is an example of a semiconductor device.

FIG. 1 is a schematic perspective view partially shown in sections, of a semiconductor device 101 which is an example of a semiconductor device according to the invention.

The semiconductor device 101 shown in FIG. 1 is a semiconductor device in which a lateral diffused MOS transistor LTa, a Zener diode ZDa and a capacitance element Ca are formed at the surface layer part of a semiconductor substrate. Besides, in the semiconductor device 101 of FIG. 1, the Zener diode ZDa and the capacitance element Ca are connected in series between the drain D and gate G of the lateral diffused MOS transistor LTa. The detailed structure of the semiconductor device 101 shown in FIG. 1 will be described below.

Figure 10:
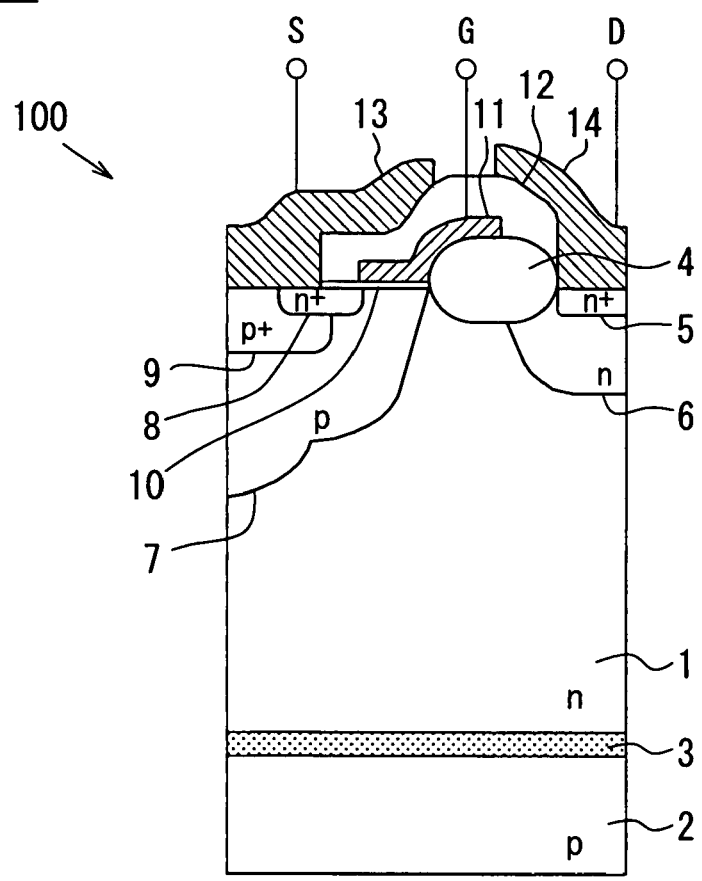
FIG. 10 is a schematic sectional view of a semiconductor device 100 which is a semiconductor device according to the prior art.
Figure 11:
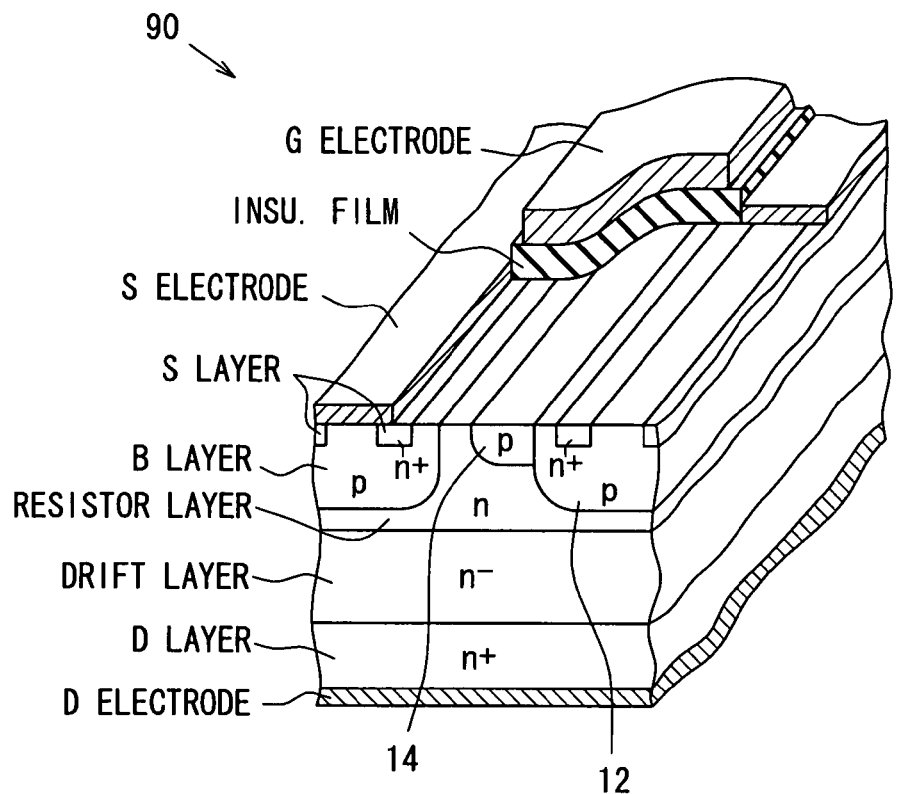
FIG. 11 is a schematic perspective view showing a relevant part, partially in section, of a semiconductor device 90 which is a semiconductor device according to the prior art.

The semiconductor substrate on which the semiconductor device 101 of FIG. 1 is formed is the same semiconductor substrate of SOI structure having a buried oxide film 3 as in the semiconductor substrate 100 shown in FIG. 10. By the way, in FIG. 1, for the sake of brevity, only a semiconductor layer 1 of N-conductivity type (n$^-$) and the buried oxide film 3 are depicted, and a support substrate 2 underlying the buried oxide film 3 is omitted from depiction. The insulating isolation of individual elements which are formed in the semiconductor layer 1 are facilitated by utilizing the semiconductor substrate of the SOI structure in this manner.

The lateral diffused MOS transistor LTa in the semiconductor device 101 of FIG. 1 has basically the same structure as that of the lateral diffused MOS transistor in the semiconductor device 100 shown in FIG. 10. More specifically, the lateral diffused MOS transistor LTa in the semiconductor device 101 is formed in the semiconductor layer 1 of the N-conductivity type (n$^-$) overlying the buried oxide film 3, and it includes a base region 7 of P-conductivity type (p) formed at the surface layer part of the semiconductor layer 1, and a source region 8 of N-conductivity type (n$^+$) formed at the surface layer part of the base region 7. Besides, the lateral diffused MOS transistor LTa includes at the surface layer part of the semiconductor layer 1, an additional N-conductivity type well region 6 which has an N-conductivity type and a concentration (n) higher than that of the semiconductor layer 1 and which is arranged so as to be spaced from the base region 7, and a drain region 5 which has an N-conductivity type and a concentration (n$^+$) higher than that of the additional N-conductivity type well region 6 and which is formed at the surface layer part of the additional N-conductivity type well region 6.

The lateral diffused MOS transistor LTa uses as a channel region, the base region 7 located between the source region 8 and the additional N-conductivity type well region 6, and it includes a gate insulating film 10 formed on the channel region, and a gate electrode 11 formed on the gate insulating film 10. Besides, the lateral diffused MOS transistor LTa includes a source electrode (not shown) connected to the source region 8, and a drain electrode (not shown) connected to the drain region 5.

In general, a lateral diffused MOS transistor wherein a source and a drain are arranged at one surface layer part of a semiconductor substrate and wherein carriers flow in the lateral direction of the semiconductor substrate is capable of high-speed switching as compared with any other transistor element, and it is suitable for utilization in a switching circuit or a switching power source. On the other hand, the lateral diffused MOS transistor is, in general, structurally less immune against an ESD (Electro-Static Discharge) surge. In contrast, with the lateral diffused MOS transistor LTa in the semiconductor device 101 of FIG. 1, an ESD surge withstand capacity can be enhanced in such a way that the concentration of the additional N-conductivity type well region 6 surrounding the drain region 5 is appropriately set in the same manner as in the lateral diffused MOS transistor in the semiconductor device 100 of FIG. 10.

Figure 12:
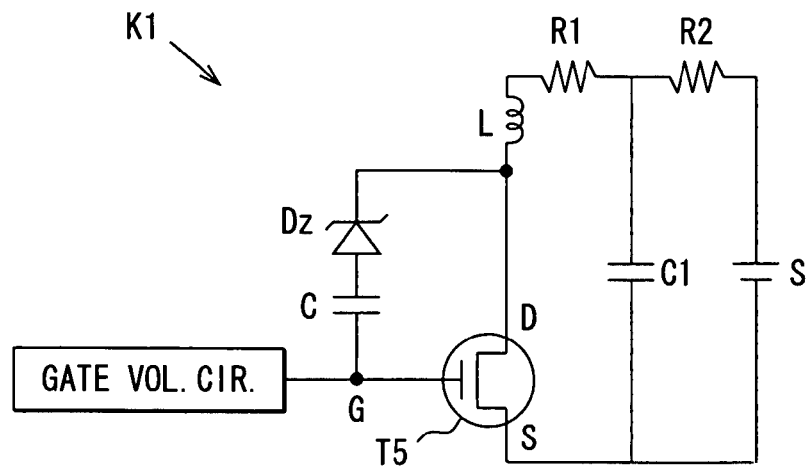
FIG. 12 is a circuit diagram of a novel switching circuit K1, according to a related art.

On the other hand, in the semiconductor device 101 of FIG. 1, unlike in the semiconductor device 100 of FIG. 10, a diffused region 20 of P-conductivity type (p+) is formed at the surface layer part of the additional N-conductivity type well region 6 so as to be spaced from the drain region 5. The Zener diode ZDa whose P-N junction plane is the interface between the P-conductivity type diffused region 20 and the additional N-conductivity type well region 6 is configured owing to the formation of this P-conductivity type diffused region 20. Besides, the capacitance element Ca is connected between the P-conductivity type diffused region 20 and the gate electrode 11. Thus, in the semiconductor device 101 of FIG. 1, the Zener diode ZDa and the capacitance element Ca are connected in series between the drain D and gate G of the lateral diffused MOS transistor LTa. Accordingly, the semiconductor device 101 of FIG. 1 has a structure in which the transistor T5, Zener diode Dz and capacitor C in the switching circuit K1 shown in FIG. 12 are formed on one semiconductor substrate.

As described above, the semiconductor device 101 shown in FIG. 1 has the lateral diffused MOS transistor LTa, Zener diode ZDa and capacitance element Ca formed on one semiconductor substrate, and it is a small-sized semiconductor device. Besides, the lateral diffused MOS transistor LTa in the semiconductor device 101 of FIG. 1 is capable of high-speed switching as compared with any other transistor element, and it is suitable for utilization in a switching circuit or a switching power source.

In general, in a switching circuit, as the operating frequency of the circuit is heightened more by employing a high-speed transistor element, the whole circuit can be made smaller in size, but a voltage change (dV/dt) based on switching becomes more abrupt, so that the overshoot of a drain voltage (a surge voltage, noise) enlarges. In the lateral diffused MOS transistor LTa in the semiconductor device 101 of FIG. 1, however, the Zener diode ZDa and the capacitance element Ca are connected in series between the drain D and the gate G. Therefore, in a case where the semiconductor device 101 is applied to the switching circuit, the contribution of the capacitance element Ca to the circuit can be interrupted by the Zener voltage of the Zener diode ZDa which is connected between the drain D and gate G together with the capacitance element Ca, in the same manner as in the switching circuit K1 shown in FIG. 12. More specifically, in the repetition cycle of the turn-ON/OFF of the semiconductor device 101, while the drain voltage of the lateral diffused MOS transistor LTa is low, the Zener diode ZDa does not turn ON to establish a state where the capacitance element Ca does not contribute, so that a drain current and the drain voltage can be changed at high speed. On the other hand, when the drain voltage rises to exceed the Zener voltage, the Zener diode ZDa breaks down, and the capacitance element Ca is added between the drain D and gate G, to make the change of a gate voltage small, so that the change rates of the drain voltage and drain current versus time lower. Thus, a voltage change (dV/dt) becomes small, and hence, the appearance of a surge voltage can be suppressed. Besides, the effect of suppressing a switching loss is obtained in this way. In the semiconductor device 101 of FIG. 1, accordingly, both the switching loss and the surge voltage can be simultaneously suppressed.

Next, simulation results concerning the characteristics of the semiconductor device 101 of FIG. 1 will be described with reference to FIGS. 2A and 2B, FIGS. 3A and 3B, and FIG. 4.

Figure 2A:
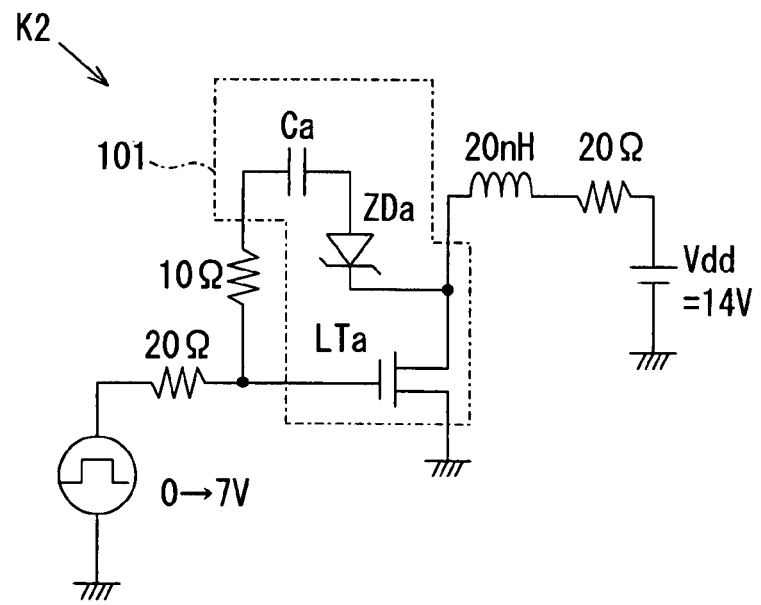
Figure 2B:
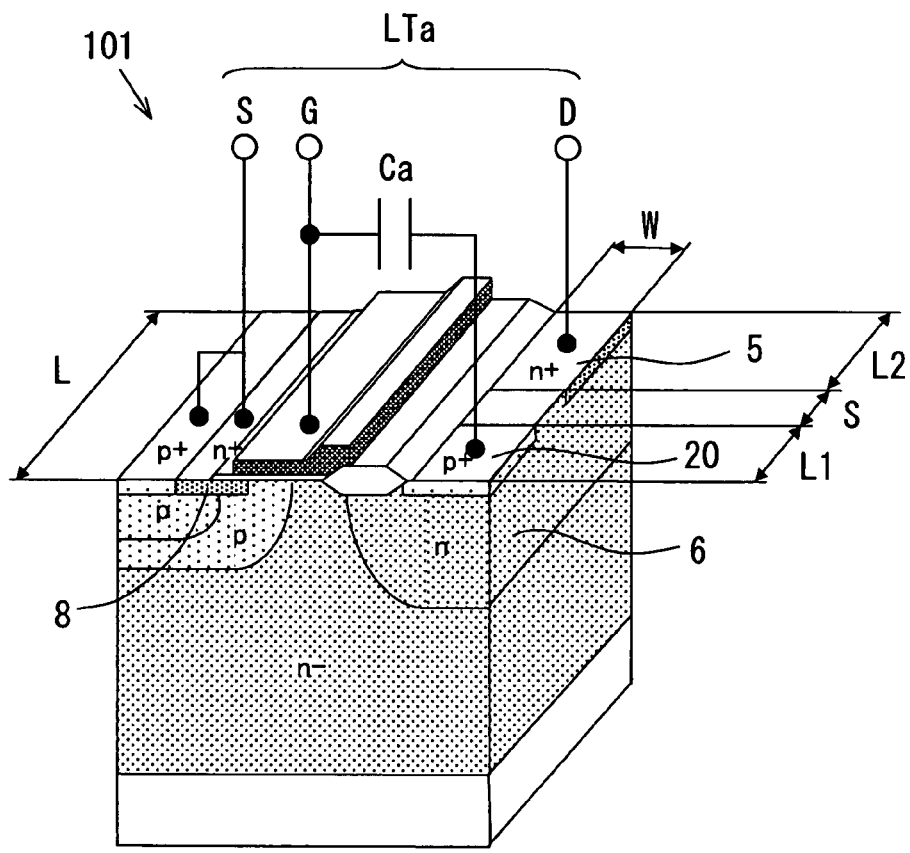
FIG. 2B is a diagram showing the strip length L1 of a P-conductivity type diffused region 20 and the strip length L2 of a drain region 5 as are used as parameters in the simulations of the semiconductor device 101.

FIG. 2A is a circuit diagram of a switching circuit K2 which is employed for the simulations of the characteristics of the semiconductor device 101. Besides, FIG. 2B is a diagram showing the strip length L1 of the P-conductivity type diffused region 20 and the strip length L2 of the drain region 5 as are used as parameters in the simulations of the semiconductor device 101 by a device simulator. In the switching circuit K2 shown in FIG. 2A, a basic part enclosed with a dot-and-dash line has the same configuration as in the switching circuit K1 shown in FIG. 12, and it corresponds to the semiconductor device 101 shown in FIG. 2B.

The semiconductor device 101 which is used for the simulations by the device simulator, has a simple structure shown in FIG. 2B. More specifically, in the semiconductor device 101, as shown in FIG. 2B, the source region 8, additional N-conductivity type well region 6, P-conductivity type diffused region 20 and drain region 5 are formed in the shapes of strips within a substrate surface. The design of the semiconductor device 101 is facilitated by shaping the source region 8, additional N-conductivity type well region 6, P-conductivity type diffused region 20 and drain region 5 into the strips in this manner. The P-conductivity type diffused region 20 and drain region 5 have the same strip width W, and they have the strip lengths L1 and L2, respectively. Besides, the P-conductivity type diffused region 20 and drain region 5 are juxtaposed with a predetermined interval S therebetween so that the directions of the strip lengths L1 and L2 may become parallel to the direction of the strip length L of the source region 8, respectively.

Figure 3A:
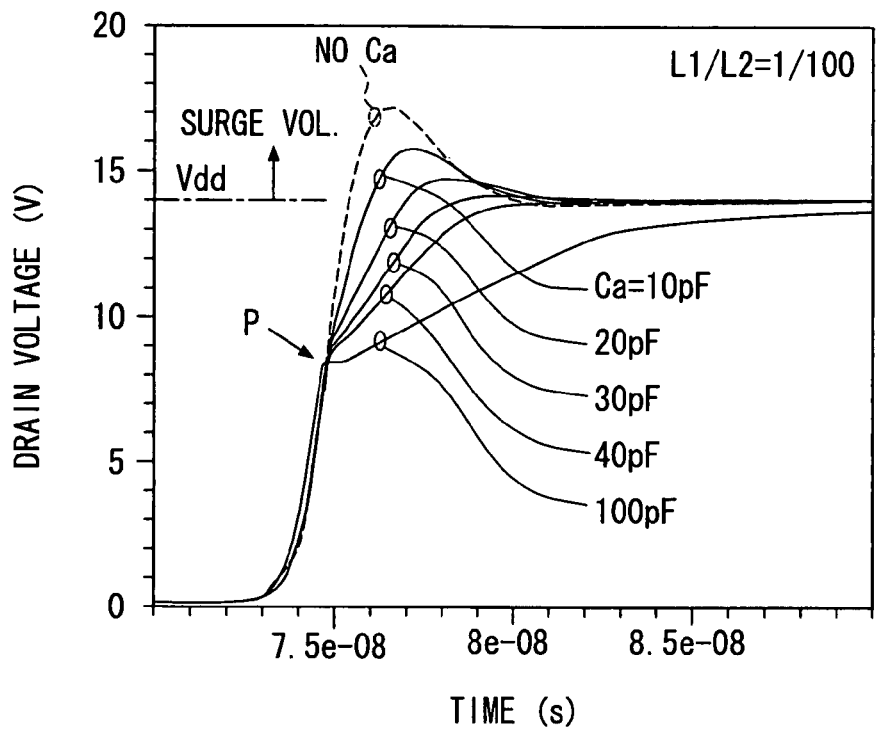
FIGS. 3A and 3B are graphs showing examples of simulation results concerning the characteristics of the semiconductor device 101, the simulation results being the changes-versus-time of drain voltages immediately after switching, in the cases where the ratios of L1/L2 were "1/100" and "1", respectively.
Figure 3B:
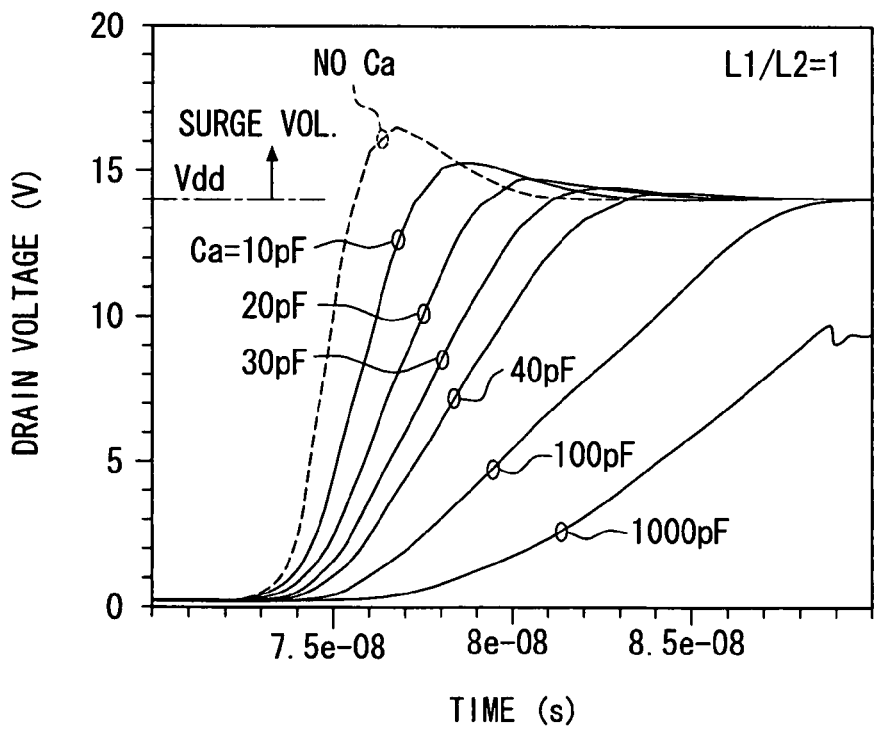

FIGS. 3A and 3B show examples of simulation results concerning the characteristics of the semiconductor device 101, and the simulation results are the changes-versus-time of drain voltages immediately after switching, in the cases where the ratios of L1/L2 in FIG. 2B were "1/100" and "1" with a parameter being the capacitance value of the capacitance element Ca, respectively. By the way, in FIGS. 3A and 3B, simulation results concerning the semiconductor device in which the Zener diode ZDa and the capacitance element Ca are not connected between the drain D and gate G of the lateral diffused MOS transistor LTa are indicated by broken lines for the sake of comparisons.

As shown in FIG. 3A, in the case of L1/L2=1/100, the gradient change of a drain voltage rise appears at a point P indicated by an arrow, in the course of the drain voltage rise immediately after the switching of the semiconductor device 101. The point P corresponds to the Zener voltage (breakdown voltage, about 8 V) of the Zener diode ZDa. As stated before, when the drain voltage rises to exceed the Zener voltage, the Zener diode ZDa breaks down, so that the capacitance element Ca is added in the drain D-gate G path. Thus, the change of a gate voltage becomes small, and the change rates of the drain voltage and a drain current versus time lower after the point P, whereby the appearance of a surge voltage is suppressed. In this way, the reduction of a switching loss is also possible.

As described above, in the semiconductor device 101 set at the ratio of L1/L2=1/100, the high-speed switching and the suppression of the surge voltage are compatible. Incidentally, the Zener voltage (breakdown voltage) of the Zener diode ZDa can be set at a desired value by the impurity concentration of the P-conductivity type diffused region 20, but it can also be set at a desired value by the interval S between the P-conductivity type diffused region 20 and the drain region 5 as shown in FIG. 2B.

On the other hand, in the case of L1/L2=1 as shown in FIG. 3B, the area of the P-conductivity type diffused region 20 is excessively large, and the Zener diode ZDa which is configured of the P-conductivity type diffused region 20 and the additional N-conductivity type well region 6 functions as a junction capacitance. Therefore, the definite gradient change point P of the drain voltage rise as exists in the case of FIG. 3A does not appear, and the change rates of the drain voltage and drain current versus time are suppressed from the initial stage of the drain voltage rise. In this case, accordingly, the rise speed of the semiconductor device 101 lowers to make the high-speed switching impossible, though the appearance of the surge voltage can be suppressed.

Figure 4:
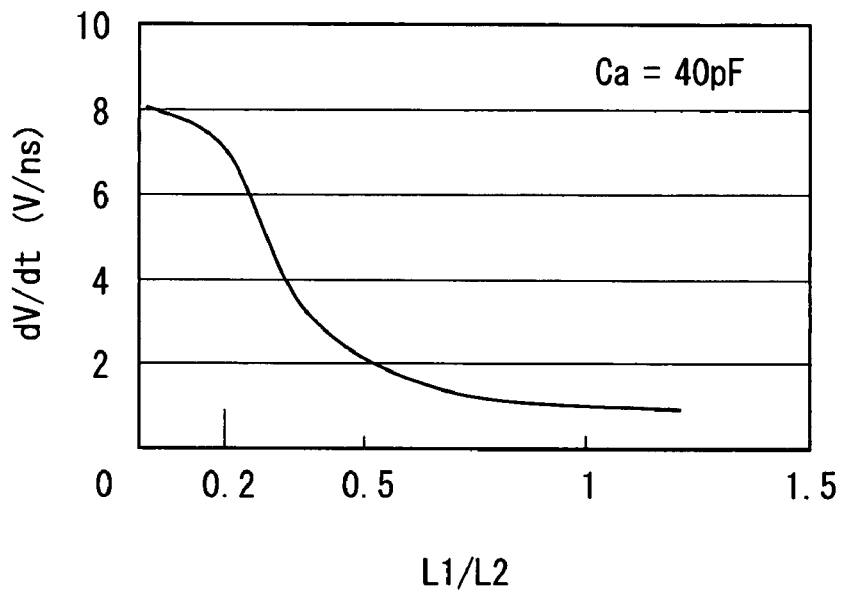
FIG. 4 is a graph showing the collected relationship between the initial gradient (dV/dt) of the rise of the drain voltage immediately after the switching and the ratio of L1/L2.

FIG. 4 is a graph showing a simulation result in the case where the capacitance value of the capacitance element Ca was 40 pF, and the simulation result is the collected relationship between the initial gradient (dV/dt) of the rise of the drain voltage immediately after the switching and the ratio of L1/L2.

As shown in FIG. 4, the initial gradient (dV/dt) of the rise of the drain voltage lowers rapidly when the ratio of L1/L2 becomes larger than 0.2. More specifically, in the case of L1/L2>1/5, the area of the P-conductivity type diffused region 20 is excessively large, and the Zener diode ZDa functions as the junction capacitance, so that the rise speed of the semiconductor device 101 lowers. In the semiconductor device 101 shown in FIG. 2A, accordingly, the ratio should preferably be set at L1/L2≦1/5. In this case, the high-speed changes of the drain current and the drain voltage at the stage where the drain voltage is low immediately after the switching is compatible with the low-speed changes of the drain current and the drain voltage at the stage where the drain voltage has risen beyond the point P indicated in FIG. 3A.

Meanwhile, in the semiconductor device 101 shown in FIGS. 1 and 2B, the capacitance value of the capacitance element Ca should preferably be larger than 1/2 of the parasitic (coupling) capacitance value Cgd between the gate and drain of the lateral diffused MOS transistor LTa. Thus, the capacitance value of the capacitance element Ca becomes sufficiently larger than the parasitic capacitance value Cgd between the gate and drain of the lateral diffused MOS transistor LTa, and the contribution to the circuit, of the capacitance element Ca connected between the drain D and the gate G together with the Zener diode ZDa is effectively demonstrated.

Figure 5:
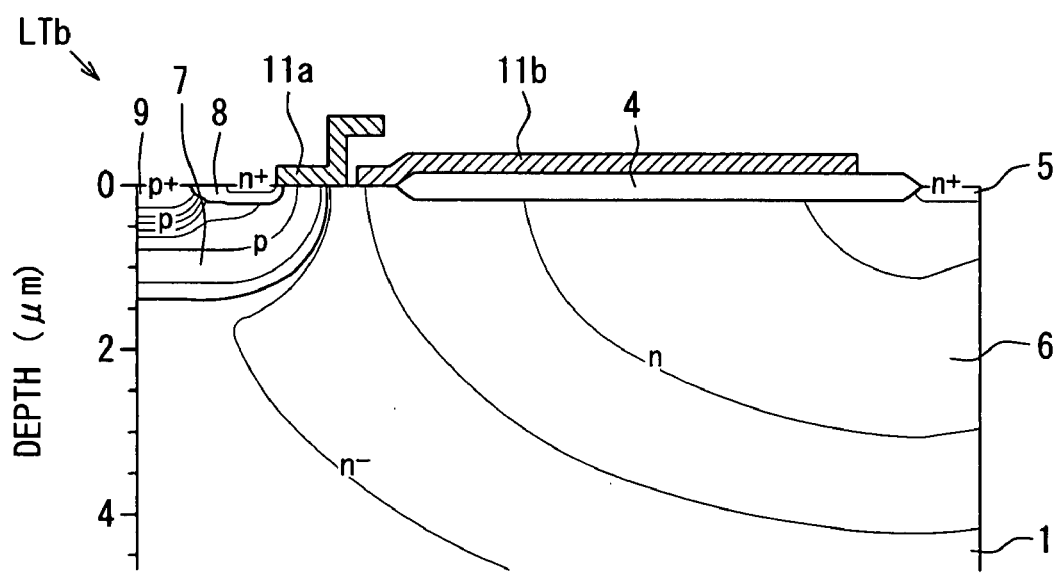
FIG. 5 is a view showing an example of a lateral diffused MOS transistor in which the parasitic capacitance value Cgd between the gate and drain thereof is small, the section of the lateral diffused MOS transistor LTb being shown together with the concentration distributions of impurities.

FIG. 5 is a view showing an example of a lateral diffused MOS transistor in which the parasitic capacitance value Cgd between the gate and drain thereof is small, the section of the lateral diffused MOS transistor LTb being shown together with the concentration distributions of impurities. By the way, in the lateral diffused MOS transistor LTb shown in FIG. 5, portions similar to those of the lateral diffused MOS transistor LTa shown in FIG. 1 are assigned the same numerals.

In the lateral diffused MOS transistor LTb shown in FIG. 5, the gate electrode 11 in the lateral diffused MOS transistor LTa of FIG. 1 is dividedly configured so as to consist of a first gate electrode 11a which covers a region extending from the source region 8 to the semiconductor layer 1, and a second gate electrode 11b which covers a region extending from the semiconductor layer 1 to the additional N-conductivity type well region 6. In the lateral diffused MOS transistor LTb of FIG. 5, only the first gate electrode 11a functions as the substantial gate electrode of the lateral diffused MOS transistor LTb, and hence, the gate-drain parasitic capacitance value Cgd becomes smaller than in the lateral diffused MOS transistor LTa of FIG. 1. Accordingly, when the lateral diffused MOS transistor LTb of FIG. 5 is adopted instead of the lateral diffused MOS transistor LTa in the semiconductor device 101 of FIG. 1, the contribution to the circuit, of the capacitance element Ca connected between the drain D and the gate G together with the Zener diode ZDa can be demonstrated more effectively as stated before.

By the way, in applying the lateral diffused MOS transistor LTb of FIG. 5 to the semiconductor device 101 of FIG. 1, a plus fixed potential of about 0 to 5 V should preferably be applied to the second gate electrode (dummy gate electrode) 11b. Besides, in forming the first gate electrode 11a and the second gate electrode 11b, the step of forming a two-layer gate structure can be utilized in a case, for example, where an EPROM (Erasable Programmable Read-Only Memory) having the two-layer gate structure is formed at a different position of the identical semiconductor substrate. Thus, the increase of a manufacturing cost can be suppressed.

In the semiconductor device 101 shown in FIGS. 1 and 2B, the concrete structure of the capacitance element Ca is not shown, but this capacitance element Ca can take any of various structures as stated below. By way of example, the capacitance element Ca in the semiconductor device 101 shown in FIGS. 1 and 2B may well be made of the capacitance between poly-silicon layers (for example, diffused regions 20, 21, 22, 23, 24 and/or gate electrodes 11, 11c) which are formed on the semiconductor substrate. Besides, the capacitance element Ca may well be made of the capacitance between metal wiring layers (for example, wirings to diffused regions 20, 21, 22, 23, 24 and/or gate electrodes 11, 11c) which are formed on the semiconductor substrate, or it may well be made of the capacitance between a poly-silicon layer (for example, diffused regions 20, 21, 22, 23, 24 and/or gate electrodes 11, 11c) and a metal wiring layer (for example, wirings to diffused regions 20, 21, 22, 23, 24 and/or gate electrodes 11, 11c) which are formed on the semiconductor substrate. Further, the capacitance element Ca may well be made of the capacitance between a diffused layer (for example, diffused regions 20, 21, 22, 23, 24) which is formed at the surface layer part of the semiconductor substrate and a poly-silicon layer (for example, gate electrodes 11, 11c) or metal wiring layer (for example, gate electrodes 11, 11c) which is formed on the semiconductor substrate, or it may well be made of the junction capacitance of a P-N junction which is formed in the semiconductor substrate. In this manner, the capacitance element Ca can be made by utilizing several portions (several forming steps) of the semiconductor device 101. Thus, the capacitance element Ca can be unitarily formed in one semiconductor substrate by utilizing the open space of the several portions. Therefore, the semiconductor device can be made small in size, and it can be made low in price owing to the shared manufacturing step.

The P-conductivity type diffused region 20 in the semiconductor device 101 may well be formed independently, but it may well be formed simultaneously with the base region 7 by way of example. Besides, in the semiconductor device 101 of FIG. 1, an additional base region 7a of P-conductivity type as has a concentration (p) higher than that of the base region 7 is formed within this base region 7 so as to lie in touch with the lower part of the source region 8. In this case, the P-conductivity type diffused region 20 may well be formed simultaneously with the additional base region 7a. Further, in the semiconductor device 101 of FIG. 1, a contact region 9 of P-conductivity type as has a concentration (p$^+$) higher than that of the base region 7 is formed at the surface layer part of the base region 7 so as to adjoin the source region 8. In this case, the P-conductivity type diffused region 20 may well be formed simultaneously with the contact region 9.

The base region 7, additional base region 7a and contact region 9 in the semiconductor device 101 of FIG. 1 have the same P-conductivity type as that of the P-conductivity type diffused region 20, and in general, their impurity concentrations and diffusion depths are different from one another. Therefore, an appropriate one of the forming steps of the above regions of the P-conductivity type is selected in adaptation to the impurity concentration and diffusion depth of the P-conductivity type diffused region 20 as are suited to the required withstand voltage of the Zener diode ZDa, and the P-conductivity type diffused region 20 is formed simultaneously with the selected forming step. Thus, in any of the foregoing cases, a new step is not needed for the formation of the P-conductivity type diffused region 20 (accordingly, the Zener diode ZDa), so that the manufacturing cost of the semiconductor device 101 can be lowered.

As thus far described, the semiconductor device 101 shown in FIG. 1 is a semiconductor device which is formed with the lateral diffused MOS transistor LTa capable of high-speed switching and which is well suited for the configuration of a switching circuit, and it is a small-sized semiconductor device which can simultaneously suppress both a switching loss and a surge voltage (noise). Especially in the semiconductor device 101 shown in FIG. 1, the lateral diffused MOS transistor LTa and the Zener diode ZDa are unitarily configured without being insulatingly isolated, so that the semiconductor device 101 is a semiconductor device whose size is smaller than in a case where the transistor LTa and the diode ZDa are formed as independent elements which are insulatingly isolated.

Figure 6:
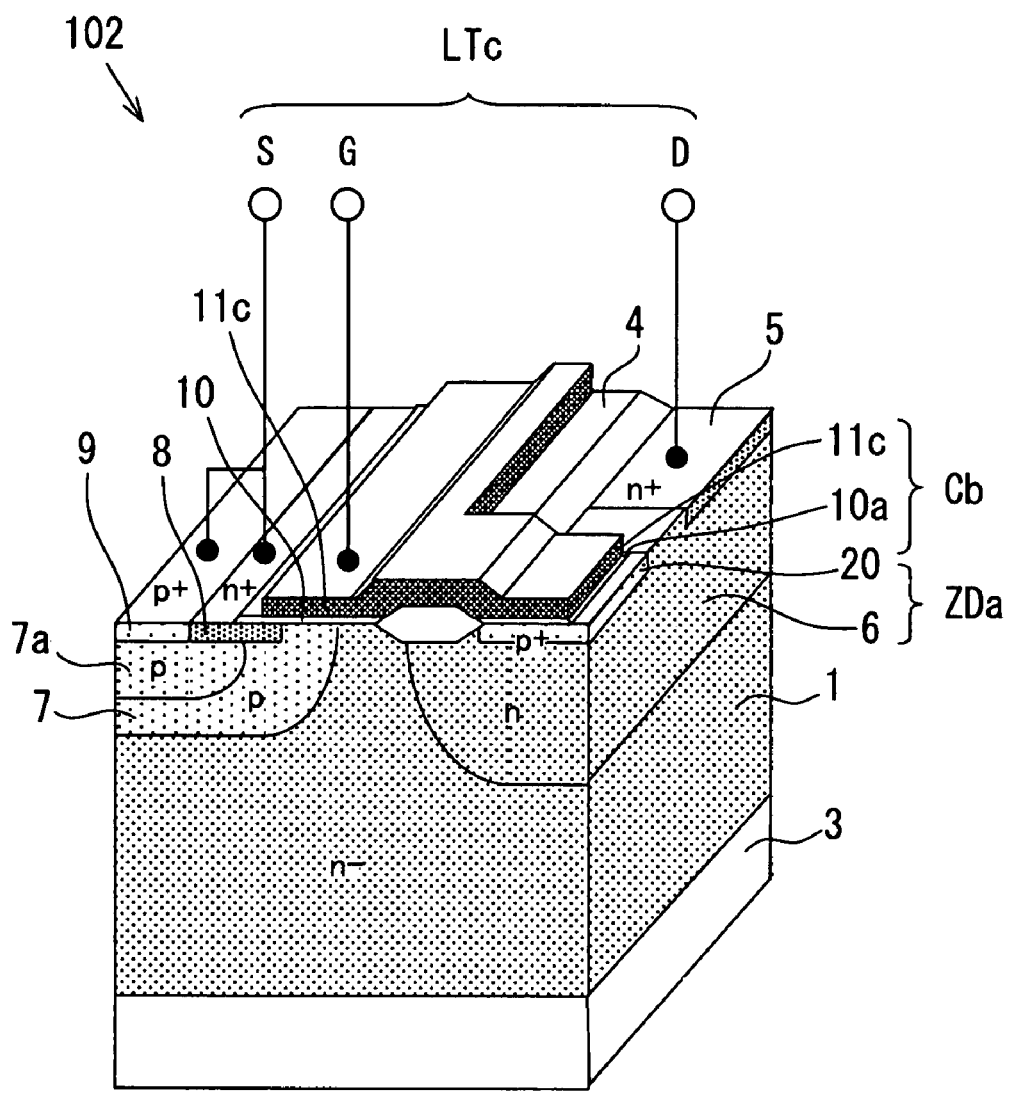
FIG. 6 is a schematic perspective view showing a relevant part, partially in section, of a semiconductor device 102 which is another example of a semiconductor device.

FIG. 6 is a schematic perspective view partially shown in sections, of a semiconductor device 102 which is another example of a semiconductor device. By the way, in the semiconductor device 102 of FIG. 6, portions similar to those of the semiconductor device 101 shown in FIG. 1 are assigned the same numerals and signs.

In the semiconductor device 102 shown in FIG. 6, the gate electrode 11c of a lateral diffused MOS transistor LTc is unitarily formed so as to cover, at least, part of a P-conductivity type diffused region 20. Thus, in the semiconductor device 102, a capacitance element Cb which is connected in series with a Zener diode ZDa between the drain D and gate G of the lateral diffused MOS transistor LTc has such a structure that it is made of the capacitance between the gate electrode 11c and the P-conductivity type diffused region 20 through an insulating film 10a. In this case, not only the lateral diffused MOS transistor LTc and the Zener diode ZDa, but also the capacitance element Cb is unitarily configured, so that the semiconductor device 102 can be made smaller in size than the semiconductor device 101 of FIG. 1.

Figure 7:
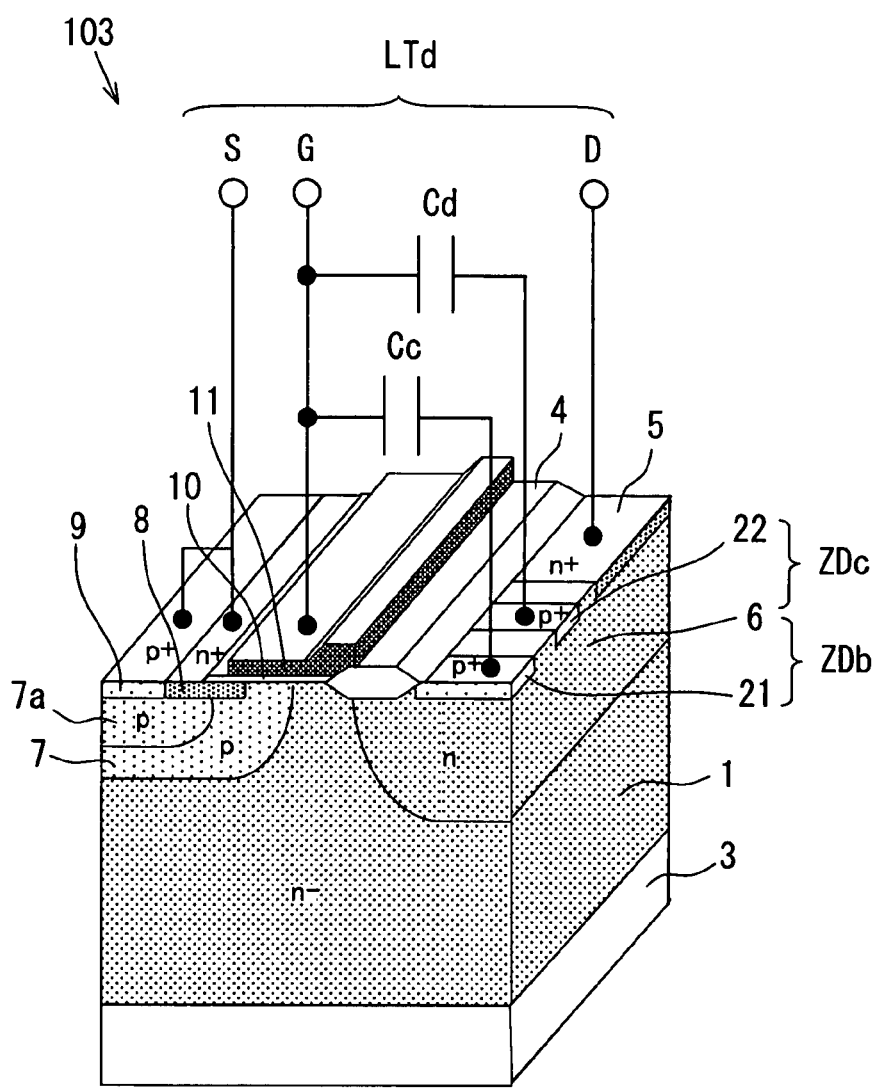
FIG. 7 is a schematic perspective view showing a relevant part, partially in section, of a semiconductor device 103 which is another example of a semiconductor device.

FIG. 7 is a schematic perspective view partially shown in sections, of a semiconductor device 103 which is another example of a semiconductor device. By the way, also in the semiconductor device 103 of FIG. 7, portions similar to those of the semiconductor device 101 shown in FIG. 1 are assigned the same numerals and signs.

In the semiconductor device 103 shown in FIG. 7, the P-conductivity type diffused region 20 in the semiconductor device 101 of FIG. 1 is formed so as to be divided into two P-conductivity type diffused regions 21 and 22. The two P-conductivity type diffused regions 21 and 22 should preferably have impurity concentrations different from each other. In this case, two Zener diodes ZDb and ZDc of different Zener voltages are configured. Besides, in the semiconductor device 103 of FIG. 7, capacitance elements Cc and Cd of different capacitance values are respectively connected in series with the P-conductivity type diffused regions 21 and 22. In the semiconductor device 103, accordingly, the Zener diode ZDb and capacitance element Cc and the Zener diode ZDc and capacitance element Cd in the series connections are connected in parallel between the drain D and gate G of a lateral diffused MOS transistor LTd.

In the semiconductor device 103 shown in FIG. 7, therefore, at the stage of the rise of the drain voltage immediately after the switching as shown in FIG. 3A, the contribution points to the circuit, of the capacitance elements Cc and Cd connected to the respective P-conductivity type diffused regions 21 and 22, and the change rates of the drain voltage after the contributions (the gradient changes of the drain voltage rise at and after the point P) can be controlled so as to be changed-over in two stages. Thus, in making the switching of high speed and the suppression of a surge voltage compatible, the semiconductor device 103 of FIG. 7 is capable of preciser control as compared with the semiconductor device 101 of FIG. 1.

Incidentally, it is needless to say that the divided formations of the P-conductivity diffused regions 21 and 22, and the connections of the capacitance elements Cc and Cd to the respective divided P-conductivity type diffused regions 21 and 22 are not limited to two in number, but that they may be of any desired plural number. Besides, as stated before, the P-conductivity type diffused regions 21 and 22 of the different impurity concentrations may well be formed simultaneously with steps appropriately selected from among the forming steps of a base region 7, an additional base region 7a and a contact region 9. Thus, a new step is not needed, so that the manufacturing cost of the semiconductor device 103 can be lowered. Further, the Zener voltages (breakdown voltages) of the Zener diodes ZDb and ZDc can be set at different values even when intervals relative to a drain region 5 are respectively changed with the impurity concentrations of the P-conductivity type diffused regions 21 and 22 equalized.

Figure 8:
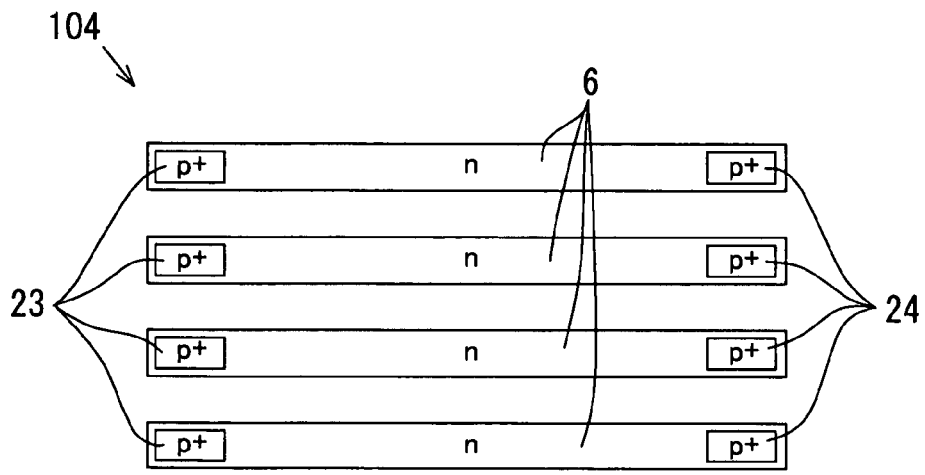
FIG. 8 is a schematic plan view showing only a relevant part of another semiconductor device 104.

FIG. 8 is a schematic plan view showing only the essential portions of another semiconductor device 104.

In the semiconductor device 104 shown in FIG. 8, P-conductivity type diffused regions 23 and 24 are arranged at the end parts of additional N-conductivity type well regions 6 of strip shape within a substrate surface. Wirings to the P-conductivity type diffused regions 23 and 24 are facilitated in such a way that these P-conductivity type diffused regions 23 and 24 are arranged at the end parts of the strip-shaped additional N-conductivity type well regions 6.

Figure 9:
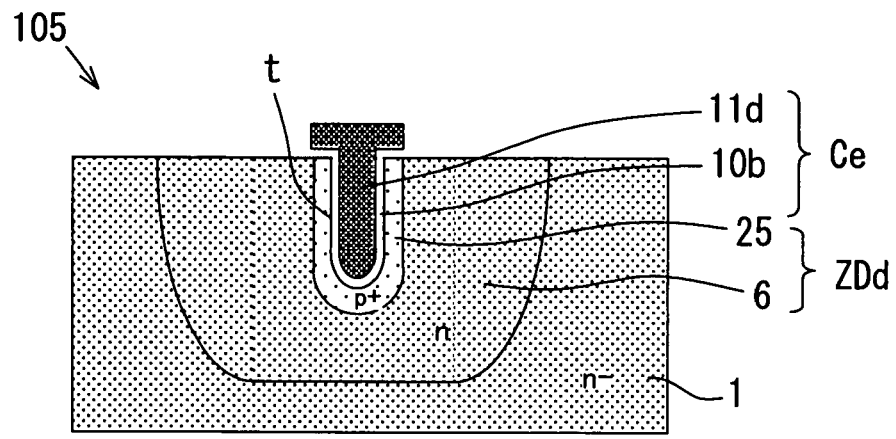
FIG. 9 is a schematic sectional view showing only a relevant part of another semiconductor device 105.

FIG. 9 is a schematic sectional view showing only the essential portions of another semiconductor device 105. Incidentally, also in the semiconductor device 105 of FIG. 9, portions similar to those of the semiconductor device 101 shown in FIG. 1 are assigned the same numerals.

In the semiconductor device 105 shown in FIG. 9, a trench t is formed at the surface layer part of an additional N-conductivity type well region 6, and a P-conductivity type diffused region 25 is formed around the sidewall and bottom of the trench t so as to be spaced from a drain region 5 which does not appear in the figure. Thus, in the semiconductor device 105, a Zener diode ZDd is configured as one whose P-N junction plane is the interface between the additional first-conductivity type well region and the second-conductivity type diffused region. Besides, a gate electrode 11d is unitarily formed so as to fill up the trench t through an insulating film 10b. Thus, in the semiconductor device 105, a capacitance element Ce is made of the capacitance between the gate electrode 11d and the P-conductivity type diffused region 25.

Also in the semiconductor device 105 of FIG. 9, a lateral diffused MOS transistor not appearing in the figure, the Zener diode ZDd and the capacitance element Ce are unitarily configured in the same manner as in the semiconductor device 102 of FIG. 6. Therefore, the semiconductor device 105 can be made a semiconductor device of smaller size as compared with the semiconductor device 101 of FIG. 1. Besides, the capacitance element Ce which is configured by employing the trench t in the semiconductor device 105 of FIG. 9 can be endowed with a larger capacitance value as compared with the capacitance element Cb in the semiconductor device 102 of FIG. 6.

As indicated above, any of the semiconductor devices 101-105 is a semiconductor device which is formed with a lateral diffused MOS transistor element capable of high-speed switching, and it is a semiconductor device of smaller size and lower price as can simultaneously suppress both a switching loss and a surge voltage (noise). Accordingly, each of the semiconductor devices 101-105 is well suited for the configuration of a switching circuit.

Incidentally, the N-channel lateral diffused MOS transistor in each of the semiconductor devices 101-105 has been an N-channel lateral diffused MOS transistor of high operating speed, in which the source region 8 and the drain region 5 are of the N-conductivity type and in which electrons are carriers. However, the semiconductor device of the invention is not restricted to the N-channel lateral diffused MOS transistor, but it may well be a semiconductor device including a P-channel lateral diffused MOS transistor in which all the conductivity types of the respective portions in each of the semiconductor devices 101-105 are reversed and in which holes are carriers.

Besides, in any of the semiconductor devices 101-103, the semiconductor substrate of SOI structure having the buried oxide film 3 has been employed, and the corresponding one of the lateral diffused MOS transistors LTa, LTc and LTd and the corresponding one(s) of the Zener diodes ZDa-ZDc are unitarily formed without being insulatingly isolated. Thus, reduction in the size of each of the semiconductor devices 101-103 has been permitted. However, the semiconductor device of the invention is not restricted to this aspect, but the lateral diffused MOS transistor and the Zener diode (and the capacitance element) may well be formed at separate positions of the semiconductor substrate in such a way that they are insulatingly isolated from each other (one another) by an insulating isolation trench which reaches the buried oxide film. In this case, since the semiconductor device of the SOI structure is employed, the design of the lateral diffused MOS transistor and that of the Zener diode can be independently performed, and the design of a semiconductor device is facilitated. Incidentally, although the semiconductor substrate of the SOI structure has been employed in each of the semiconductor devices 101-103, the semiconductor device of the invention is not restricted thereto, but it can also be formed by employing any desired semiconductor substrate.

The above disclosure has the following aspects.

According to an aspect of the present disclosure, a semiconductor device includes: a semiconductor substrate; a lateral MOS transistor disposed in the substrate; a Zener diode disposed in the substrate; and a capacitor disposed in the substrate. The transistor includes a drain and a gate, and the diode and the capacitor are coupled in series between the drain and the gate.

This device has minimized dimensions and high switching speed. Further, both of a switching loss and a surge voltage are improved.

Alternatively, the transistor may have a parasitic capacitance between the gate and the drain, and the capacitor may have a capacitance, which is larger than a half of the parasitic capacitance.

Alternatively, the substrate may have a SOI structure with an embedded oxide film. The substrate further includes a trench, which reaches the embedded oxide film, and the transistor and the diode are electrically separated by the trench.

Alternatively, the transistor may include: a first conductive type semiconductor layer, which is provided by the substrate; a base region having a second conductive type, wherein the base region is disposed in a surface portion of the first conductive type semiconductor layer; a source region having the first conductive type, wherein the source region is disposed in a surface portion of the base region; a well region having the first conductive type, wherein the well region is disposed in another surface portion of the first conductive type semiconductor layer in such a manner that the well region is separated from the base region, and wherein the well region has an impurity concentration higher than an impurity concentration of the first conductive type semiconductor layer; a drain region having the first conductive type, wherein the drain region is disposed in a surface portion of the well region, and wherein the drain region has an impurity concentration higher than the impurity concentration of the well region; a channel region provided by a part of the base region, which is disposed between the source region and the well region; a gate insulation film disposed on the channel region; a gate electrode disposed on the gate insulation film; a source electrode coupled with the source region; and a drain electrode coupled with the drain region.

Alternatively, the substrate may have a SOI structure with an embedded oxide film. Further, the substrate may further include a diffusion region having the second conductive type. The diffusion region is disposed in another surface portion of the well region in such a manner that the diffusion region is separated from the drain region, and the diode has a PN junction between the diffusion region and the well region. Furthermore, the transistor may further include an additional base region having the second conductive type. The additional base region has an impurity concentration higher than the impurity concentration of the base region. The additional base region is disposed in the base region in such a manner that the additional base region contacts and disposed under the source region, and the diffusion region and the additional base region are formed at the same time.

Alternatively, the source region, the well region, the diffusion region and the drain region may provide a stripe pattern on a substrate surface of the substrate. The diffusion region has a stripe width, which is substantially equal to a stripe width of the drain region. The diffusion region has a stripe length defined as $L1$, and the drain region has a stripe length defined as $L2$. The stripe length of $L1$ and the stripe length of $L2$ have a relationship of $L1/L2 \leqq 1/5$, and the diffusion region has a longitudinal direction of the stripe pattern, which is parallel to a longitudinal direction of the stripe pattern of the drain region, and parallel to a longitudinal direction of the stripe pattern of the source region so that the diffusion region, the drain region and the source region are arranged at a predetermined intervals. Further, the diffusion region may be disposed on one end of the stripe pattern of the well region.

Alternatively, the gate electrode may include a first gate electrode and a second gate electrode. The first gate electrode covers an area between the source region and the first conductive type semiconductor layer, and the second gate electrode covers an area between first conductive type semiconductor layer and the well region.

Alternatively, the substrate may further include a trench disposed on a surface portion of the well region. The diffusion region is disposed around the trench in such a manner that the diffusion region is separated from the drain region. The diode has a PN junction between the well region and the diffusion region. The gate electrode is disposed in the trench through an insulation film between an inner wall of the trench and the gate electrode, and the capacitor is provided by a capacitance between the gate electrode and the diffusion region.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
a semiconductor substrate;
a lateral MOS transistor disposed in the substrate;
a Zener diode disposed in the substrate; and
a capacitor disposed on the substrate, wherein
the transistor includes a drain and a gate, and
the diode and the capacitor are coupled in series between the drain and the gate.

2. The device according to claim 1, wherein
the transistor has a parasitic capacitance between the gate and the drain, and
the capacitor has a capacitance, which is larger than a half of the parasitic capacitance.

3. The device according to claim 1, wherein
the substrate has a SOI structure with an embedded oxide film,
the substrate further includes a trench, which reaches the embedded oxide film, and
the transistor and the diode are electrically separated by the trench.

4. The device according to claim 1, wherein
the transistor includes:
a first conductive type semiconductor layer, which is provided by the substrate;
a base region having a second conductive type, wherein the base region is disposed in a surface portion of the first conductive type semiconductor layer;
a source region having the first conductive type, wherein the source region is disposed in a surface portion of the base region;
a well region having the first conductive type, wherein the well region is disposed in another surface portion of the first conductive type semiconductor layer in such a manner that the well region is separated from the base region, and wherein the well region has an impurity concentration higher than an impurity concentration of the first conductive type semiconductor layer;
a drain region having the first conductive type, wherein the drain region is disposed in a surface portion of the well region, and wherein the drain region has an impurity concentration higher than the impurity concentration of the well region;
a channel region provided by a part of the base region, which is disposed between the source region and the well region;
a gate insulation film disposed on the channel region;
a gate electrode disposed on the gate insulation film;
a source electrode coupled with the source region; and
a drain electrode coupled with the drain region.

5. The device according to claim 4, wherein
the substrate has a SOI structure with an embedded oxide film.

6. The device according to claim 4, wherein
the substrate further includes a diffusion region having the second conductive type,
the diffusion region is disposed in another surface portion of the well region in such a manner that the diffusion region is separated from the drain region, and
the diode has a PN junction between the diffusion region and the well region.

7. The device according to claim 6, wherein
the transistor further includes an additional base region having the second conductive type,
the additional base region has an impurity concentration higher than the impurity concentration of the base region,
the additional base region is disposed in the base region in such a manner that the additional base region contacts and disposed under the source region, and
the diffusion region and the additional base region are formed at the same time.

8. The device according to claim 6, wherein
the transistor further includes a contact region having the second conductive type,
the contact region has an impurity concentration higher than the impurity concentration of the base region,
the contact region is disposed in a surface portion of the base region in such a manner that the contact region contacts the source region, and
the diffusion region and the contact region are formed at the same time.

9. The device according to claim 6, wherein
the source region, the well region, the diffusion region and the drain region provide a stripe pattern on a substrate surface of the substrate,
the diffusion region has a stripe width, which is substantially equal to a stripe width of the drain region,
the diffusion region has a stripe length defined as L1, and the drain region has a stripe length defined as L2,
the stripe length of L1 and the stripe length of L2 have a relationship of $L1/L2 \leq 1/5$, and
the diffusion region and the drain regions are in the same stripe pattern in the longitudinal direction and together are in parallel to the source region stripe pattern.

10. The device according to claim 9, wherein
the diffusion region is disposed on one end of the stripe pattern of the well region.

11. The device according to claim 6, wherein
the diffusion region includes a plurality of portions.

12. The device according to claim 11, wherein
each portion of the diffusion region has an impurity concentration different from each other,
the capacitor includes a plurality of capacitance elements, each of which has a capacitance different from each other, and
each portion is coupled in series with the capacitance element.

13. The device according to claim 6, wherein
the gate electrode covers at least a part of the diffusion region, and
the capacitor is provided by a capacitance between the gate electrode and the diffusion region.

14. The device according to claim 4, wherein
the gate electrode includes a first gate electrode and a second gate electrode,
the first gate electrode covers an area between the source region and the first conductive type semiconductor layer, and
the second gate electrode covers an area between first conductive type semiconductor layer and the well region.

15. The device according to claim 4, wherein
the substrate further includes a trench disposed on a surface portion of the well region,
the diffusion region is disposed around the trench in such a manner that the diffusion region is separated from the drain region, the diode has a PN junction between the well region and the diffusion region, the gate electrode is disposed in the trench through an insulation film between an inner wall of the trench and the gate electrode, and the capacitor is provided by a capacitance between the gate electrode and the diffusion region.

16. The device according to claim 1, further comprising:

a pair of poly silicon films disposed on the substrate, wherein the capacitor is provided by a capacitance between the pair of poly silicon films.

17. The device according to claim 1, further comprising:

a pair of metal wiring films disposed on the substrate, wherein the capacitor is provided by a capacitance between the pair of metal wiring films.

18. The device according to claim 1, further comprising:

a poly silicon film disposed on the substrate; and a metal wiring film disposed on the substrate, wherein the capacitor is provided by a capacitance between the poly silicon film and the metal wiring film.

19. The device according to claim 1, further comprising:

a diffusion layer disposed in a surface portion of the substrate; and a poly silicon film or a metal wiring film disposed on the substrate, wherein the capacitor is provided by a capacitance between the diffusion layer and the poly silicon film or the metal wiring film.

20. The device according to claim 1, wherein the capacitor is provided by a junction capacitance of a PN junction disposed in the substrate.

* * * * *